(12) United States Patent
Zhitenev

(10) Patent No.: US 7,615,779 B2
(45) Date of Patent: Nov. 10, 2009

(54) FORMING ELECTRODES TO SMALL ELECTRONIC DEVICES HAVING SELF-ASSEMBLED ORGANIC LAYERS

(75) Inventor: Nikolai Borisovich Zhitenev, Watchung, NJ (US)

(73) Assignee: Alcatel-Lucent USA Inc., Murray Hill, NJ (US)

( * ) Notice: Subject to any disclaimer, the term of this patent is extended or adjusted under 35 U.S.C. 154(b) by 483 days.

(21) Appl. No.: 11/387,436

(22) Filed: Mar. 23, 2006

(65) Prior Publication Data

US 2009/0242875 A1 Oct. 1, 2009

(51) Int. Cl.
*H01L 51/30* (2006.01)
(52) U.S. Cl. .......................... 257/40; 257/288
(58) Field of Classification Search .............. 257/40, 257/288, E51.024–E51.031
See application file for complete search history.

(56) References Cited

U.S. PATENT DOCUMENTS

| 7,521,710 | B2* | 4/2009 | Nakamura et al. | 257/40 |
| 2005/0056828 | A1* | 3/2005 | Wada et al. | 257/40 |
| 2005/0101063 | A1* | 5/2005 | Tour et al. | 438/142 |

OTHER PUBLICATIONS

C. P. Collier C P, et al., "Catenane-Based Solid State Electronically Reconfigurable Switch," *Science* vol. 289, p. 1172 (2000).
J. Chen, et al., "Large on-off ratios and negative differential resistance in a molecular electronic device," *Science* vol. 286, p. 1550 (1999).
Y. Chen, et al., "Nanoscale molecular-switch crossbar circuits," *Nanotechnology* vol. 14, p. 462 (2003).
W. Wang et al., "Electronic Transport in Molecular Self-Assembled Monolayer Devices," *Proc. IEEE*, vol. 93, No. 10, p. 1815 (2005).
M. D. Austin, et al., "Fabrication of a molecular self-assembled monolayer diode using nanoimprint lithography," *Nano Lett.* vol. 3, p. 1687 (2003).
C. N. Lau, et al., "Direct observation of nanoscale switching centers in metal/molecule/metal structures," *Nano Lett.* vol. 4, p. 569 (2004).
G. Philipp, et al., "Gold cluster formation at the interface of a gold/Langmuir-Blodgett film/gold microsandwich resulting in Coulomb charging phenomena," *J. Appl. Phys.* vol. 85, p. 3374 (1999).

(Continued)

*Primary Examiner*—Cuong Q Nguyen
(74) *Attorney, Agent, or Firm*—Michael J. Urbano

(57) ABSTRACT

In one embodiment of the invention, a method of fabricating a SAM device comprises the steps of: (a) providing a substrate having a top surface and a first metal electrode disposed on the top surface, (b) annealing the first metal electrode, (c) forming a SAM layer on a major surface of the first electrode, the SAM layer having a free surface such that the SAM is disposed between the free surface and the major surface of the first electrode, and (d) forming a second metal electrode on the free surface of the molecular layer. Forming step (d) includes the step of (d1) depositing the second metal electrode in at least two distinct depositions separated by an interruption period of time when essentially no deposition of the second metal takes place. SAM FETs fabricated using this method are also described.

6 Claims, 6 Drawing Sheets

OTHER PUBLICATIONS

K. A. Son, et al., "Role of Stress on Charge Transfer through Self-Assembled Alkanethiol Monolayers on Au," *Phys. Rev. Lett.* vol. 83, p. 5357 (2001).

T. Ohgi et aL, "Charging effects in gold nanoclusters grown on octanedithiol layers," *Appl. Phys. Lett.* vol. 79, p. 2453 (2001).

T. Ohgi T, et al., "Scanning tunneling microscopy and X-ray photoelectron spectroscopy of silver deposited octanethiol self-assembled monolayers," *Surf. Sci.* vol. 493, p. 453 (2001).

B. D. Boer, et al., "Metallic contact formation for molecular electronics: interactions between vapor-deposited metals and self-assembled monolayers of conjugated mono- and dithiols," *Langmuir* vol. 20, p. 1539 (2004).

A. V. Walker, et al., "Interaction of vapor-deposited Ti and Au with molecular wires," *Appl. Phys. Lett.* vol. 84, p. 4008 (2004).

T. A. Fulton, et al., "Observation of single-electron charging effects in small tunnel junctions," *Phys. Rev. Lett.* vol. 59, p. 109 (1987).

C. R. Kagan, et al., "Evaluations and Considerations for Self-Assembled Monolayer Field-Effect Transistors," *Nano Lett.* vol. 3, p. 119 (2003).

J. O. Lee, et al., "Absence of strong gate effects in electrical measurements on phenylene-based conjugated molecules," *Nano Lett.* vol. 3, p. 113 (2003).

N. B. Zhitenev, et al., "Conductance of small molecular junctions," *Phys. Rev. Lett.* vol. 88, p. 226801 (2002).

B. D. Boer, et al., "Synthesis and characterization of conjugated mono- and dithiol oligomers and characterization of their self-assembled monolayers," *Langmuir* vol. 19, p. 4272 (2003).

W. R. Jiang, et al., "Structure and bonding issues at the interface between gold and self-assembled conjugated dithiol monolayers," *Langmiur* vol. 21, p. 8751 (2005).

N. B. Zhitenev, et al., "Single- and Multigrain Nanojunctions with a Self-Assembled Monolayer of Conjugated Molecules," *Phys. Rev. Lett.* vol. 92, p. 186805 (2004).

N. B. Zhitenev, et al., "Molecular nano-junctions formed with different metallic electrodes," *Nanotechnology* vol. 16, p. 495 (2005).

A. Salomon, et al., "Comparison of electronic transport measurements on organic molecules," *Adv. Mater.* vol. 15, p. 1881 (2003).

C. Kergueris, et al., "Electron transport through a metal-molecule-metal junction," *Phys. Rev. B* vol. 59, p. 12505 (1999).

J. Heurich et al., "Electrical transport through single-molecule junctions: From molecular orbitals to conduction channels," *Phys. Rev. Lett.* vol. 88, p. 256803 (2002).

J. K. Tomfohr, et al., "Complex band structure, decay lengths, and Fermi level alignment in simple molecular electronic systems," *Phys. Rev. B* vol. 65, p. 245105 (2002).

E. Cimpoiasu, et al., "Aluminum oxide layers as possible components for layered tunnel barriers," *J. Appl. Phys.* vol. 96, p. 1088 (2004).

M. Stadele, et al., Enhancement of the effective tunnel mass in ultrathin silicon dioxide layers *J. Appl. Phys.* vol. 93, p. 2681 (2003).

C. Joachim, et al., "The effective mass of an electron when tunneling through a molecular wire," *Chem. Phys.* vol. 281, p. 347 (2002).

N. B. Zhitenev et al., "Control of topography, stress and diffusion at molecule-metal interface," *Nanotechnology,* vol. 17, p. 1272 (2006).

\* cited by examiner

FORMING ELECTRODES TO SMALL ELECTRONIC DEVICES HAVING SELF-ASSEMBLED ORGANIC LAYERS

BACKGROUND OF THE INVENTION

Field of the Invention

This invention relates to forming electrodes to electronic devices and, more particularly, to forming electrodes to small electronic devices that include thin self-assembled organic layers.

REFERENCES

In the following sections cross-reference is made to each of the following references, each of which is incorporated herein in its entirety. Each cross-reference is made by bracketing the number(s) in the following list corresponding to the cited reference(s).
1. C. P. Collier C P, et al., "Catenane-Based Solid State Electronically Reconfigurable Switch," Science Vol. 289, p. 1172 (2000).
2. J. Chen, et al., "Large on-off ratios and negative differential resistance in a molecular electronic device," Science Vol. 286, p. 1550 (1999).
3. Y. Chen, et al., "Nanoscale molecular-switch crossbar circuits," Nanotechnology Vol. 14, p. 462 (2003).
4. W. Wang et al., "Electronic Transport in Molecular Self-Assembled Monolayer Devices," Proc. IEEE, Vol. 93, No. 10, p. 1815 (2005).
5. M. D. Austin, et al., "Fabrication of a molecular self-assembled monolayer diode using nanoimprint lithography," Nano Lett. Vol. 3, p. 1687 (2003).
6. C. N. Lau, et al., "Direct observation of nanoscale switching centers in metal/molecule/metal structures," Nano Lett. Vol. 4, p. 569 (2004).
7. G. Philipp, et al., "Gold cluster formation at the interface of a gold/Langmuir-Blodgett film/gold microsandwich resulting in Coulomb charging phenomena," J Appl. Phys. Vol. 85, p. 3374 (1999).
8. K. A. Son, et al., "Role of Stress on Charge Transfer through Self-Assembled Alkanethiol Monolayers on Au," Phys. Rev. Lett. Vol. 83, p. 5357 (2001).
9. T. Ohgi et al., "Charging effects in gold nanoclusters grown on octanedithiol layers," Appl. Phys. Lett. Vol. 79, p. 2453 (2001).
10. T. Ohgi T, et al., "Scanning tunneling microscopy and X-ray photoelectron spectroscopy of silver deposited octanethiol self-assembled monolayers," Surf. Sci. Vol. 493, p. 453 (2001).
11. B. D. Boer, et al., "Metallic contact formation for molecular electronics: interactions between vapor-deposited metals and self-assembled monolayers of conjugated mono- and dithiols," Langmuir Vol. 20, p. 1539 (2004).
12. A. V. WalKer, et al., "Interaction of vapor-deposited Ti and Au with molecular wires," Appl. Phys. Lett. Vol. 84, p. 4008 (2004).
13. T. A. Fulton, et al., "Observation of single-electron charging effects in small tunnel junctions," Phys. Rev. Lett. Vol. 59, p. 109 (1987).
14. C. R. Kagan, et al., "Evaluations and Considerations for Self-Assembled Monolayer Field-Effect Transistors," Nano Lett. Vol. 3, p. 119 (2003).
15. J. O. Lee, et al. "Absence of strong gate effects in electrical measurements on phenylene-based conjugated molecules," Nano Lett. Vol. 3, p. 113 (2003).
16. N. B. Zhitenev, et al., "Conductance of small molecular-junctions," Phys. Rev. Lett. Vol. 88, p. 226801 (2002).
17. B. D. Boer, et al., "Synthesis and characterization of conjugated mono- and dithiol oligomers and characterization of their self-assembled monolayers," Langmuir Vol. 19, p. 4272 (2003).
18. W. R. Jiang, et al., "Structure and bonding issues at the interface between gold and self-assembled conjugated dithiol monolayers," Langmuir Vol. 21, p. 8751 (2005).
19. N. B. Zhitenev, et al., "Single- and Multigrain Nanojunctions with a Self-Assembled Monolayer of Conjugated Molecules," Phys. Rev. Lett. Vol. 92, p. 186805 (2004).
20. N. B. Zhitenev, et al., "Molecular nano-junctions formed with different metallic electrodes," Nanotechnology Vol. 16, p. 495 (2005).
21. A. Salomon, et al., "Comparison of electronic transport measurements on organic molecules," Adv. Mater. Vol. 15, p. 1881 (2003).
22. C. Kergueris, et al. "Electron transport through a metal-molecule-metal junction," Phys. Rev. B Vol. 59, p. 12505 (1999).
23. J. Heurich et al., "Electrical transport through single-molecule junctions: From molecular orbitals to conduction channels," Phys. Rev. Lett. Vol. 88, p. 256803 (2002).
24. J. K. Tomfohr, et al., "Complex band structure, decay lengths, and Fermi level alignment in simple molecular electronic systems," Phys. Rev. B Vol. 65, p. 245105 (2002).
25. E. Cimpoiasu, et al., "Aluminum oxide layers as possible components for layered tunnel barriers," J. Appl. Phys. Vol. 96, p. 1088 (2004).
26. M. Stadele, et al., "Enhancement of the effective tunnel mass in ultrathin silicon dioxide layers J. Appl. Phys. Vol. 93, p. 2681 (2003).
27. C. Joachim, et al., "The effective mass of an electron when tunneling through a molecular wire," Chem. Phys. Vol. 281, p. 347 (2002).

DISCUSSION OF THE RELATED ART

Reliable and scalable integration of organic molecules within nanoscale electronic devices has the potential to dramatically expand available device functionality. Similar to other device platforms, such as Si-based technology, the electronic properties of devices that are just a few atomic layers thick are determined not solely by the host material but also by dopants, defects and electronic states at interfaces. Incorporation of molecules in small devices calls for the simultaneous solution of many interrelated material, electronic and chemical issues.

One type of nanoscale device (e.g., an FET) is built of self-assembled molecular (SAM) layers disposed between two metal electrodes [1-3]. Typically, organic molecules do not have electronic states at energies close to the Fermi energy level of common metals. Instead of conventional band-to-band conduction, electrons travel between the metal electrodes by tunneling through the molecules in the gap between the highest occupied molecular orbital (HOMO) and the lowest unoccupied molecular orbital (LUMO). Tunneling transmission is governed by the energy difference between the Fermi level of the contacts and the closest molecular orbital and by the spatial extent of the molecular orbital. Because tunneling transmission is exponentially related to energy and distance, the conductance of real devices can be much larger or much smaller than that produced by molecular tunneling.

A single defect state in a molecular layer with defect energy close to the Fermi level can dramatically increase the transmission. The most common origin of defects in molecular devices is penetration of metal from the contacts into the molecular layer. The penetrating metal typically has one of three forms: (1) a filament, by which I mean a nanoscale metal wire that connects the source and drain electrodes to one another, thereby fully shorting the device; (2) a particle, by which I mean a nanoscale metal piece within a SAM layer but not connected to either the source or drain electrode; or (3) a protrusion, by which I mean a nanoscale metal piece connected to either the source or drain electrode, but not both. A protrusion may be merely a microscopic deviation of an electrode surface from perfect flatness, or it may be a cluster of metal atoms attached to the electrode surface.

For example, during and after fabrication, filaments can form, either completely shorting the source and the drain electrodes and limiting the yield of useful FET devices [4, 5] or strongly increasing device conductance [6], or particles can penetrate into the SAM layers [7]. In the process of metal contact growth and crystallization the electrode may protrude into the SAM layer, thus deforming molecules and affecting conductance [8]. Distorted chemical bonds at the interface between metal and molecule can decrease the tunneling transmission.

In addition, metal films commonly used as electrodes (e.g., Au, Ag, Ti, and Pt) grow and interact very differently on top of SAM layers [9-12]. Currently, every experiment is unique in that the placement of the atoms/molecules of the relevant device constituents (e.g., metal contacts, SAM layers, and uncontrolled impurities) cannot be determined accurately.

Thus, a need remains in the art for a technique that allows electrodes to be formed on SAM devices without the adverse effects discussed above; that is, without shorting the devices or increasing tunneling conductance significantly.

BRIEF SUMMARY OF THE INVENTION

In accordance with one aspect of my invention, I have discovered a fabrication process that addresses the prior art difficulties in making reliable electrical contact to a SAM layer. In one embodiment, a method of fabricating a SAM device comprises the steps of: (a) providing a substrate having a top surface and a first metal electrode disposed on the top surface, (b) annealing the first metal electrode, (c) forming a SAM layer on a major surface of the first electrode, the SAM layer having a free surface such that the self-aligned molecules are disposed between the free surface and the major surface of the first electrode, and (d) forming a second metal electrode on the free surface of the molecular layer. Forming-step-(d) includes the step of (d1) depositing the second metal electrode in at least two distinct depositions separated by an interruption period of time when essentially no deposition of the second metal takes place.

In accordance with another aspect of my invention, apparatus comprises a substrate having a top surface and first metal electrode disposed on at least a portion of the top surface, the first metal electrode having an annealed crystal structure. A SAM layer is disposed on a major surface of the first metal electrode, the SAM layer having a free surface such that the self-aligned molecules are interposed between the free surface and the major surface. A second metal electrode has at least a portion thereof disposed on the free surface of the SAM layer. Importantly, the portion of the second metal electrode includes metal clusters.

BRIEF DESCRIPTION OF THE SEVERAL VIEWS OF THE DRAWING

My invention, together with its various features and advantages, can be readily understood from the following more detailed description taken in conjunction with the accompanying drawing, in which:

FIGS. 4a-4c show schematically a stencil mask (template) defined within a stack of insulating layers formed on a Si substrate; FIGS. 4b and 4c are partially cut away; FIGS. 4d-4f show the fabrication of a SAM junction using the template of FIG. 4c; FIG. 4d zooms in on the central region of FIG. 4c; and FIGS. 4g-4i show SEM images of the junctions (FIG. 4g) and examples of both small area (FIG. 4h) and large area (FIG. 4i) SAM junctions;

In FIG. 6a $\tau_{rel}$=1 hr, and a T3 SAM layer was deposited; in FIG. 6b $\tau_{rel}$=1 hr, and a C10 SAM layer was deposited; in FIG. 6c $\tau_{rel}$=3 min, and T3 SAM layer was deposited; in FIG. 6d $\tau_{rel}$=3 min, and a C10 SAM layer was deposited; FIG. 6e shows the distribution of junction resistance from the devices of FIG. 6c after soft electrical breakdown. The resistance range $\Delta R$, corresponding to the leads resistance (shorted junctions), extends between the vertical dashed lines. Horizontal rectangles 60a-60e show expected ranges of resistance assuming that (i) only one molecule per cluster forms good bonds at both ends and (ii) tunneling conductance of $10^{-6}$-$10^{-8}\Omega^{-1}$ for T3 molecules and $10^{-8}$-$10^{-9}\Omega^{-1}$ for C10 molecules. FIG. 6f is an STM image of clusters formed at the interface between the T3 SAM layer and the top Au layer.

In FIG. 7a curves 71 and 72 show I-V characteristics measured on SAM FETs that both included SAM layers of C10 molecules, but in one case the top electrode was made of Ti (i.e., a C10-Ti junction; curve 71) and in the other it was made of Ag (i.e., a C10-Ag junction; curve 72). Note, the current scales for the two curves are different. Measurements were made at T=8 K. The insets 71i, 72i show differential conductance dI/dV of curves 71, 72, respectively, as a function of the source-to-drain voltage ($V_{sd}$); FIG. 7b shows a family of I-V curves measured at different temperatures ranging from 6.5 K to 285 K on a SAM FET that included a C10-SAM layer and a Au top electrode (i.e., a C10-Au junction; and FIG. 7c shows a family of dI/dV curves measured at T=8 K on T3-Au junctions at different gate voltages $V_g$ ranging from +1.5 V to −1.5 V. Note the breaks 73 and 75 in the left and right current axes, respectively, and further note the different scales of these axes (i.e., μA on the left; nA on the right); FIG. 8a depicts metal filaments from the top electrode penetrating through a SAM layer and shorting the device; FIG. 8b illustrates the smoothing effect of annealing the bottom electrode, and FIG. 8c illustrates the formation of metal clusters at the interface between the SAM layer and the top electrode.

DETAILED DESCRIPTION OF THE INVENTION

General SAM Device Processing

Figure 1:
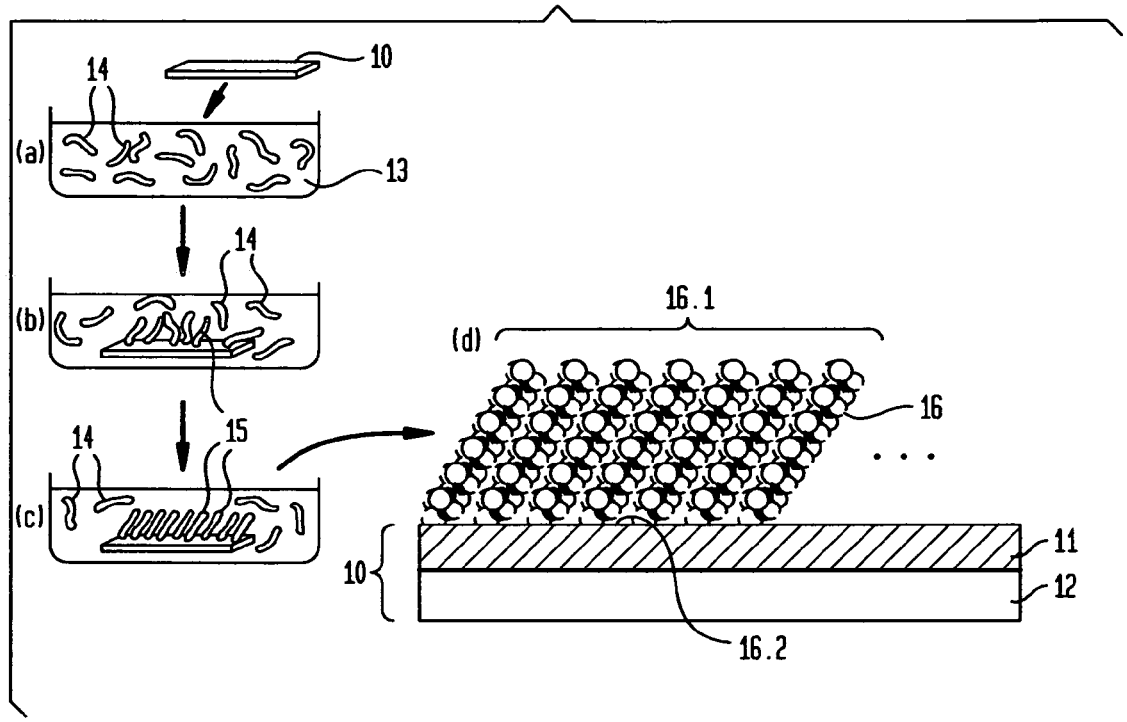
FIG. 1 illustrates a prior art process sequence for forming a SAM layer on a metal layer, as shown in FIG. 1d.

With reference now to FIG. 1, there is shown a well-known, typical sequence of process steps for forming a SAM layer on a metal layer. The process begins with providing a body 10, which comprises a metal layer 11 disposed on a top major surface of a substrate 12. Illustratively the metal layer 11 (e.g., Au, Ag, Ti, or Pt) is evaporated onto a semiconductor substrate (e.g., Si). The body 10 is then submerged into a solution containing organic molecules 14 that are capable of self-assembly [e.g., a conjugated molecule such as terthiophene-dithiol (T3), or a fully saturated molecule such as decanedithiol (C10)]. Although both of these molecules are thiols, other organic molecules, such as primary, secondary and tertiary amines, isocyanides and carboxy acids are also suitable. For simplicity, however, the following description assumes that the organic molecules are thiols.

As shown in FIG. 1a, the thiol molecules 14 are randomly oriented at the start, but when the substrate 10 is place into the solution, as shown in FIG. 1b, some of the molecules 15 begin to adsorb onto the metal layer 11. After a suitable period of time (e.g., 5 min -24 hr), as shown in FIG. 1c, the adsorbed thiol molecules 15 organize themselves so that they are all oriented in essentially the same direction. (The free, non-adsorbed thiol molecules 14 remain randomly oriented in the solution 13.) As a result, a nanoscale SAM layer 16 is formed on the metal layer 11, as shown in FIG. 1d. The term nanoscale means that typically SAM layers are on the order of only a few nanometers thick. The upper surface of the SAM layer 16 is referred to as a free surface 16.1, whereas the lower surface of the SAM layer 16 is herein referred to as a bound surface 16.2, which is adsorbed onto the upper, major surface of metal layer 11.

Figure 2:
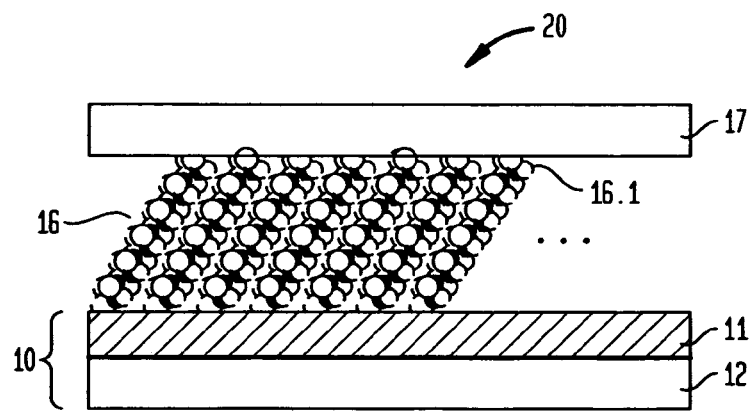
FIG. 2 is a schematic, side view of a prior art SAM device.
Figure 3:
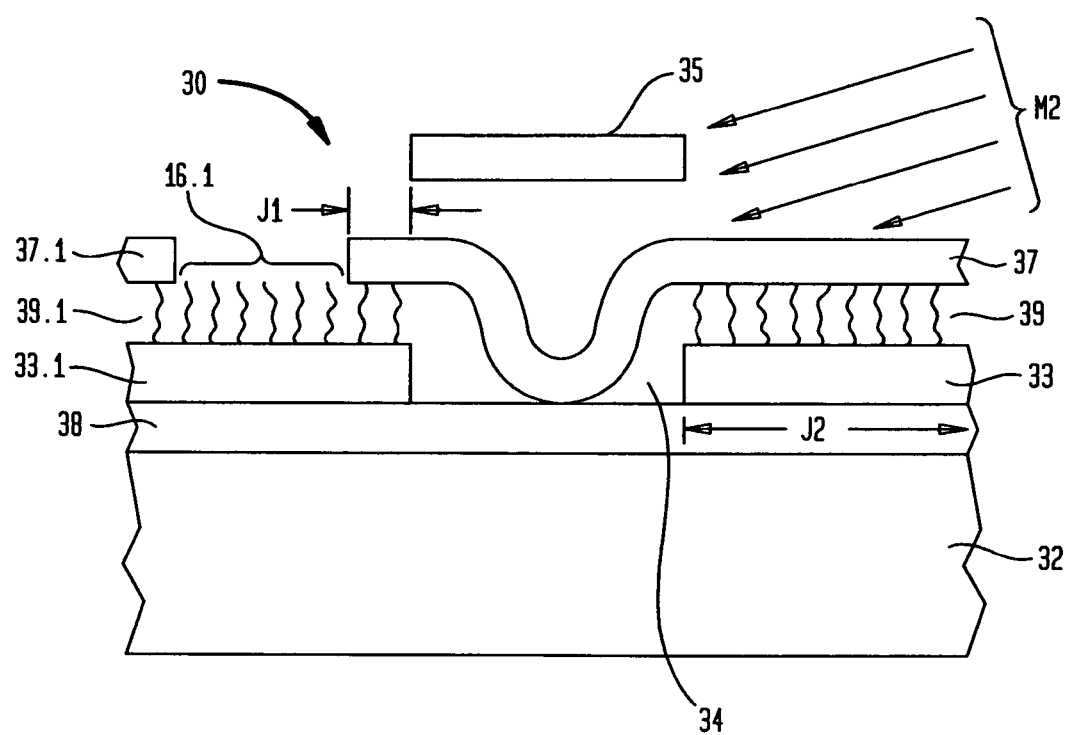
FIG. 3 is a schematic, cross-sectional view of a SAM FET, in accordance with one embodiment of my invention.

To utilize the SAM intermediate structure of FIG. 1d as a device, as shown in FIG. 2, typically a second metal layer 17 is formed (e.g., by evaporation) on the free surface 16.1 of SAM layer 16. From a device perspective, metal layers 11 and 20 function as electrodes, and a suitable voltage applied across the electrodes alters the conductance of the SAM layer 16. The device may serve as a diode 20, as shown in FIG. 2, or as a FET 30, as shown in FIG. 3. In the latter case, FET 30 includes, for example, a Si substrate 32, a silicon oxide insulating layer 38 formed on the top, major surface of substrate 32, and a first patterned metal electrode 33, 33.1 formed on oxide layer 38. Electrode 33, 33.1 has an opening 34, and SAM layers 39, 39.1, are formed on the top, major surfaces of electrodes 33, 33.1, respectively, but not in the opening 34. Note, the fact that there is no SAM layer in the opening 34 is not essential for the proposed device operation. Finally, a second metal electrode 37, 37.1 is formed on a portion of the free surfaces of SAM layers 39, 39.1, but the portion of interest is the small-area junction J1 located between the right end of first electrode 33.1 and the left end of second electrode 37. The small area junction J1 is realized by means of a shadow mask 35 and oblique deposition of metal M2 to form the second electrode 37, 37.1, which will be further explained in conjunction with FIG. 4.

Using standard FET terminology, an FET with its junction defined by the dimension designated J1 includes a gate formed by the substrate 32, a channel formed by the SAM layer 36, a drain (or source) formed by the first metal electrode 33.1, and a source (or drain) formed by the second metal electrode 37. Of course, the area of the junction would be defined by the dimension J1 times a depth dimension (not shown) perpendicular to the plane of the paper.

Although another junction J2 is also formed between first electrode 33 and the right side of second electrode 37, it has a much larger area and is, therefore, of less interest from a device standpoint. The much larger area of junction J2 results in much higher lower resistance (most likely it is shorted). The device properties are defined by the much higher resistance of the smaller area junction J1.

Preferred Embodiment

Fabricating devices of type depicted in FIGS. 1-3 is conceptually straightforward, but practically difficult. As discussed above, one of the principal hurdles is to form electrodes on the extremely thin (nanoscale) SAM layer without shorting out the layer or dramatically increasing the device conductance. To this end, I have found that certain aspects of the electrode formation process are important.

Thus, after forming the first metal electrode 33, 33.1 (FIG. 3) on oxide layer 38, the electrode should be annealed. Suitable annealing increases the average crystal grain size of electrode 33, 33.1, and, in addition, reduces the roughness of its top major surface on which the SAM layer 39, 39.1 forms (i.e., self-assembles). Illustratively, surface roughness having an initial amplitude of 1-3 nm and periodicity of 20 nm is reduced to a post-anneal amplitude of 0.3 nm and increased to a post-anneal periodicity of 100's of nm. Suitable annealing conditions include heating at a temperature of about 200-300 C for a time period ranging from a few minutes to less than 30 min; e.g., 250 C for 5 min; 200 C for up to 30 min.

In addition, the second metal electrode 37, 37.1 should be deposited in at least two sequential depositions interrupted by a time interval during which essentially no deposition of metal takes place. During this interruption (or pause), metal clusters are formed on the portion of the bottom surface of electrode 37, 37.1. in contact with the free-surface 16.1 of SAM layer 39, 39.1. In this regard, it is preferable that the second electrode 37, 37.1 comprises Au, but gold alloys may also be suitable. It is also preferred that the SAM material comprises a fully saturated molecule (e.g., C10). Suitable interruption conditions include completely stopping deposition (e.g., evaporation) of second electrode metal for at least 3 min but less than 60 min. Moreover, multiple interruptions of second metal deposition may also be suitable.

Example

In order to determine the efficacy of my approach to fabricating metal electrodes on nanoscale SAM devices, I studied the various phenomena affecting the conductance of SAM devices by systematically varying the growth conditions at the metal-molecule interface. Specifically, first I optimized the surface topography of the bottom metal electrode used for the assembly of molecular layer by reducing the density of structural defects in the SAM layer. Reduced defect density dramatically reduced diffusion of the top (second) metal contact 37 (FIG. 3) through the SAM layer 36, increasing the device yield to >90%. Then, I altered the chemical bonding and surface topography at the interface between the top metal and the SAM layer.

In the following experiments, various materials, dimension and operating conditions are provided by way of illustration only and, unless otherwise expressly stated, are not intended to limit the scope of the invention.

Experimental Details

The general approach for SAM device fabrication was to perform the most critical patterning of nanometer features without having formed the SAM layer yet. Then the SAM layer was self-assembled, and the device structure was completed with relatively non-invasive processing steps. Small shadow masks were defined within a stack 48 (FIG. 4) of insulating layers formed on Si substrates to obtain features below the lithographic limit [5, 13-16]. In practice, a multiplicity of devices was formed on a single substrate, but for simplicity the fabrication of only a single device is described below.

More specifically, a shown in FIGS. 4a-4c, a 200 nm thick layer 48.1 of $SiO_2$ was grown on a degeneratively doped Si substrate 42 to isolate the substrate from the devices (FETs). A small junction window (e.g., 5 μm×5 μm; not shown) in $SiO_2$ layer 48.1 was defined by standard photolithography and etching of layer 48.1. This window set the location of the junctions to be formed later. Next, a 400 nm thick layer 48.2 of $Si_3N_4$ was deposited on layer 48.1 (filling the junction window) and a 150 nm thick layer 48.3 of $SiO_2$ was deposited on layer 48.2, thereby defining a stack 48 (FIG. 4a) from which masks would ultimately be formed. Standard photolithography and etching were used to pattern the top layer 48.3; that is, to form larger electrode windows 44.1 (e.g., 100 um×100 um) connected to elongated windows 44.2, which were separated by a small shadow mask bridge 44.3. Next, as shown in FIG. 4b, $Si_3N_4$ layer 48.2 was selectively etched, thereby undercutting the top $SiO_2$ layer 48.3 and exposing a portion of the top surface of Si substrate 42 within the junction window. Finally, a high quality 10 nm thick $SiO_2$ layer (not shown) was re-grown on the exposed Si substrate surface within the junction window, thereby allowing use of the doped substrate as a gate electrode.

Fabrication of metal-SAM-metal junctions using this type of mask is illustrated in FIGS. 4c-4f, where FIG. 4d zooms in on the central region of FIG. 4c. First, bottom electrodes 43.1 and the elongated segments 43.2 were defined by vertical evaporation of metal M1 through shadow mask 45 (FIG. 4c). In the current study, the bottom electrode was a polycrystalline bi-layer of Ti/Au (300 Å of Au on 5 Å of Ti), which will hereinafter be referred to simply as a Au electrode. The electrode segments 43.2 were separated by a bridge (or gap) 43.3 having a width in the range of 100-300 nm. Next, SAM layers 49 (FIG. 4e) were deposited from solution in a conventional manner onto bottom electrodes 43.1 (FIG. 4c) and onto the electrode segments 43.2 (FIGS. 4c and 4d). Two types of molecules, representing opposite ends of expected electronic functionality, were used in this study. Terthiophenedithiol (T3), synthesized using previously described methods [17], is a conjugated molecule with thiol groups responsible for chemical attachment to metal electrodes. Decanedithiol (C10) is a fully saturated molecule with a length of 1.5 nm similar to the length of T3 molecules.

The substrates with bottom Au electrodes were soaked in a tetrahydrofuran (THF) solution of the thiols (about 0.01 mM) at room temperature for 24 hours, then rinsed with THF, toluene and isopropanol. Both molecules formed SAM layers 49, 49.1 with thiol terminations exposed at their top (free surface) interfaces as proven by nanotransfer experiments [18].

Finally, a top electrode 47, 47.1 was formed by evaporation of metal M2 (FIG. 4f) through the same shadow mask 45, but from an oblique angle. The size (area) of the junction is controlled by the size of the bridge and the angle of the M2 metal evaporation.

SEM images of representative junctions are shown in FIGS. 4g-4i. FIG. 4g includes four junctions, the inset being a magnified view of one of them. FIG. 4h shows a small area junction (e.g., ~30×30 $nm^2$), and FIG. 4h shows a larger area (~300×300 $nm^2$) junction.

A single chip contained 84 separate devices, allowing statistical analysis to be performed on nominally equivalent junctions and the junction sizes to be varied. The electrical characterization did not require the removal of the mask stack or metal accumulated on top surface of the mask, thus minimizing this potential source of damage or contamination.

Experimental Results

Figure 4:
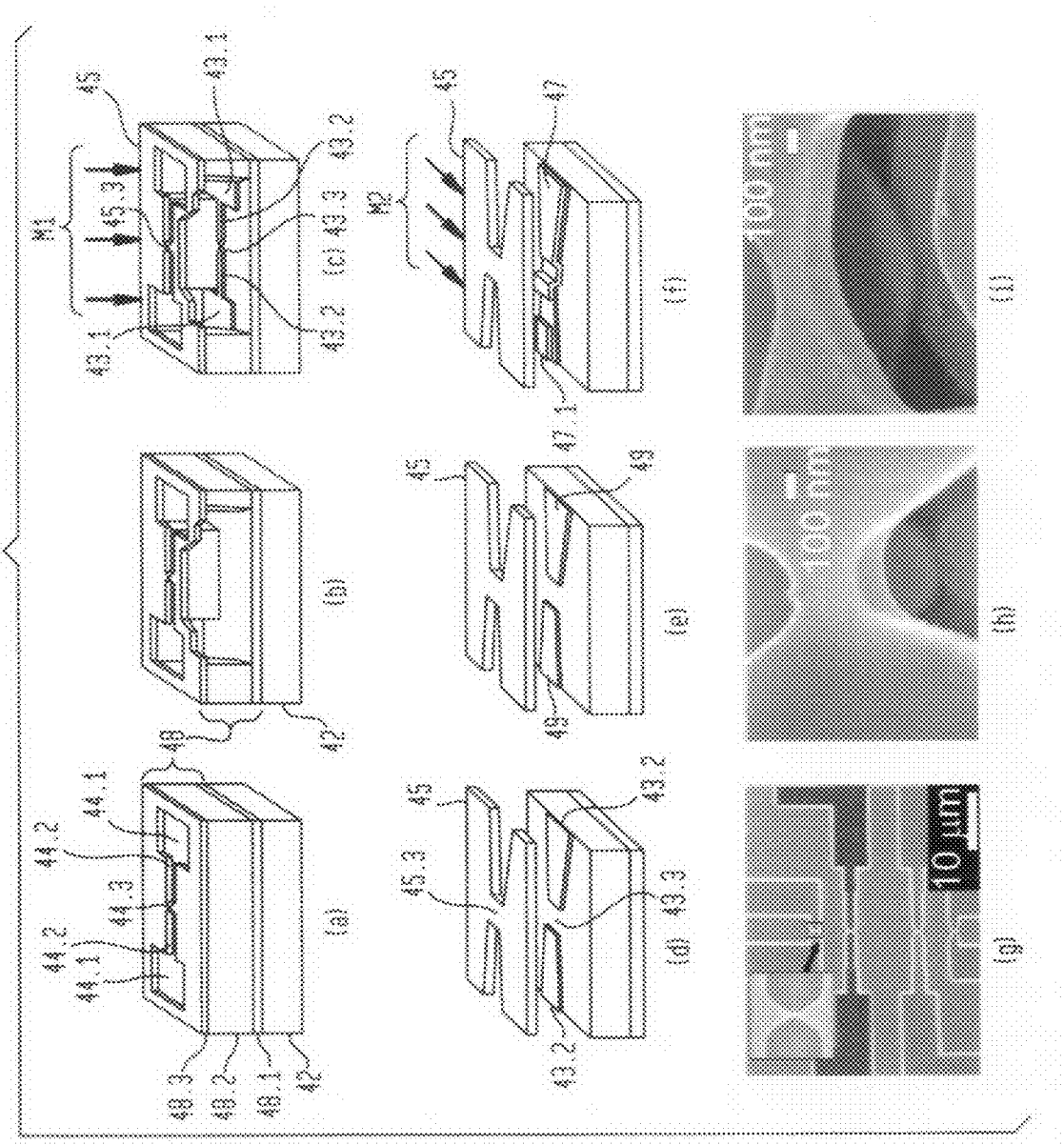
FIG. 4 illustrates the fabrication of templates and molecular junctions, in accordance with another embodiment of my invention.

In a first set of experiments, both T3 and C10 molecules were assembled on an as-deposited polycrystalline Au bottom electrode 43, 43.1 (FIG. 4). The top electrode 47, 47.1 was an 8 nm thick layer of M2 metal (Au or Ag). Resistance of all junctions appeared to be indistinguishable from the lead resistance, which was in the range of 300Ω to 1 kΩ for devices with different lead geometries. I concluded that the evaporated M2 metal penetrated through the SAM layers 49, 49.1 shorting the devices. These results are consistent with earlier observations of a low yield of non-shorted multi-grain junctions formed with different nano-templates [19]. The evaporated top M2 metal easily diffused near defects in molecular packing induced by multiple grain boundaries of the bottom electrode 43, 43.1.

In the next set of experiments, the chips were annealed (250 C, 5 min) after deposition of the bottom polycrystalline Au electrode 43, 43.1. The annealing step modified the grain structure of the polycrystalline Au, making the grains smoother and the grain size larger. The distribution of device resistance measured at room temperature is shown in FIGS. 5a-5b. Although the variation was very broad, the yield of non-shorted devices was above ~96% for T3 and above ~92% for C10 SAM devices. This result is much higher than in previous experiments by others (0.5%-5%) with similar electrode arrangements [4, 5, 15]. Surprisingly, the apparent median resistance for T3 SAM devices was higher than for C10 SAM devices, contrary to all expectations, which clearly showed that the conductance of real junctions was not directly determined by the electronic structures of the molecules. No scaling of the resistance with the junction area was observed.

Figure 5:
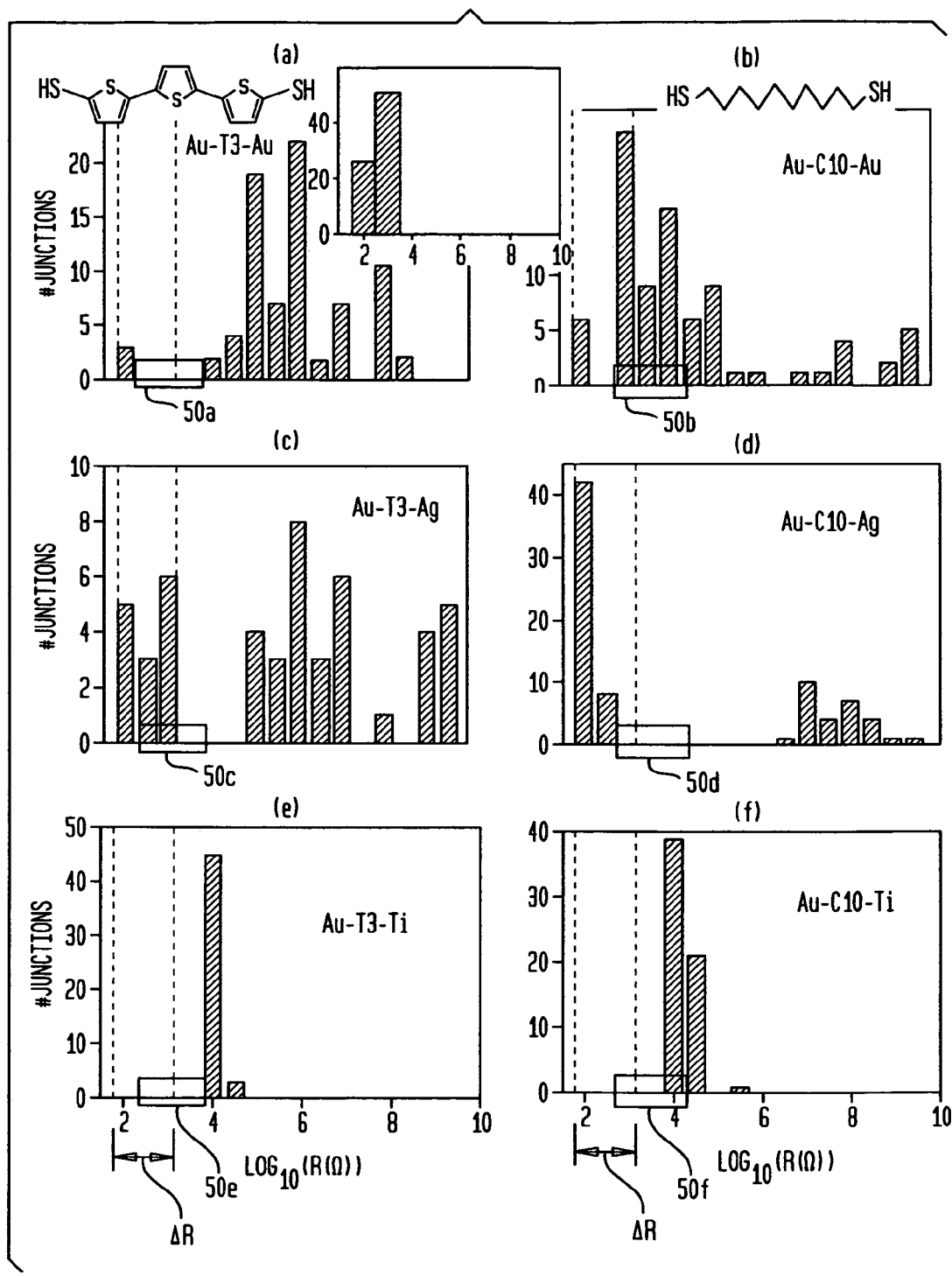
FIG. 5 shows the distribution of junction resistance at room temperature of SAM devices fabricated in accordance with the procedures of FIG. 4. The resistance range $\Delta R$, corresponding to the lead resistance (shorted junctions), extends between the vertical dashed lines. Horizontal rectangles 50a-50f show expected ranges of resistance assuming that (i) all self-aligned molecules inside junctions are bonded to both electrodes and (ii) tunneling conductance of $10^{-6}$-$10^{-8}\Omega^{-1}$ for T3 molecules and $10^{-8}$-$10^{-9}\Omega^{-1}$ for C10 molecules. The inset between FIGS. 5a and 5b shows results for junctions fabricated on an as-deposited Au electrode.

To study bond formation at the top interface M2 metals with different chemical reactivities were overlaid on SAM layers. In particular, 7 nm thick overlayers of Au, Ag or Ti were deposited on separate SAM layers. The results are shown in FIG. 5. Silver is more reactive than Au, and titanium is known to strongly react not only with thiol groups at the top interface but also with carbon atoms [12]. FIGS. 5c & 5d show the electrical properties of T3-Ag junctions, which were generally similar to those of T3-Au junctions (FIGS. 5a & 5b). But, FIG. 5c shows that a significant percentage of the C10-Ag junctions were shorted. As shown in FIGS. 5e & 5f, the conductance of the junctions with Ti overlayers was consistently higher. The overall histograms are very similar for both T3 and C10 SAM devices; that is, compared to other cases shown in FIGS. 5a-5d, the histograms are narrow and are centered at close values of resistances.

Figure 6:
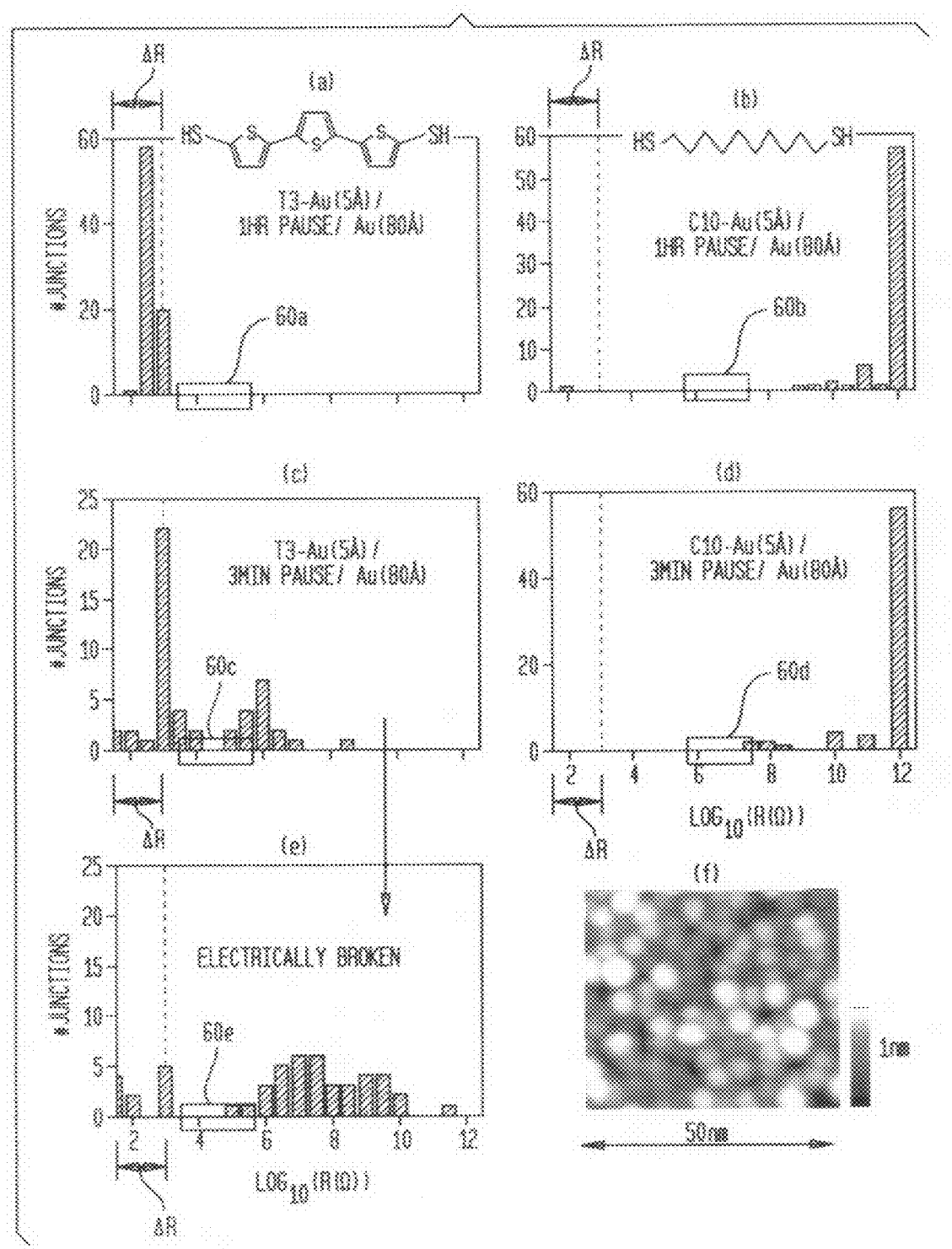
FIG. 6 shows the distribution of junction resistance of SAM devices also fabricated in accordance with the procedures of FIG. 4, but with clusters created at the interface between the top electrode and the SAM layer. The top metal contact was formed by depositing a thin (0.5 nm) Au layer first, letting the layer relax for time $\tau_{rel}$, and then depositing a thicker (8 nm) thick Au layer.

The microscopic topography at the interface between the SAM layer 49, 49.1 and the top electrode 47, 47.1 is generally unknown. In an attempt to control the topography, M2 metal clusters (e.g., FIG. 6f) were intentionally created at that interface. First, a thin (0.3-0.5 nm) overlayer of Au was evaporated on the free surface of SAM layer 49, 49.1, simultaneously on the FET chips and on reference SAM layers assembled on an atomically flat Au substrate. The evaporation chamber was vented, and the reference sample was used to examine the topography of the Au overlayer by STM. Au clusters with an average diameter of ~6 nm were clearly seen (FIG. 6f). After a 1 hr interruption (pause) the junction fabrication was completed by evaporating a thicker (8 nm), second overlayer of Au on the first Au overlayer.

The electrical properties of these junctions (FIGS. 6a & 6b) were dramatically different from junctions formed with the uninterrupted Au evaporation (FIGS. 5a & 5b). All T3-SAM junctions were shorted (FIG. 6a), whereas all C10-SAM junctions were highly resistive (FIG. 6b; for convenience, all devices with $R>10^{12}\Omega$ were lumped into a single bin).

In the next set of experiments, after deposition of a thin (0.5 nm) overlayer of Au, the evaporation was interrupted for only 3 min followed by continuous evaporation of a thicker (8 nm) layer of Au on top of the thin layer of Au. (The histograms are shown in FIGS. 6c & 6d). The results clearly fall between those fabricated using the continuous Au evaporation technique (FIG. 5) and those fabricated using the interrupted (for 1 hr) Au evaporation technique (FIGS. 6a & 6b). Half of the T3-Au junctions are not shorted (FIG. 6c); and the C10-Au junctions were less resistive on average (FIG. 6d). The shorted T3-Au junctions can be electrically driven into a more resistive state, as illustrated by the vertical arrow between FIG. 6c and FIG. 6e. Voltage pulses with ~30-50 mV amplitude and rise time below 1 μs usually triggered modification of the shorted junctions. Applying dc voltage up to 1V did not change the junction conductance. The distribution of resistances of junctions after the breakdown is shown in FIG. 6e.

Figure 7:
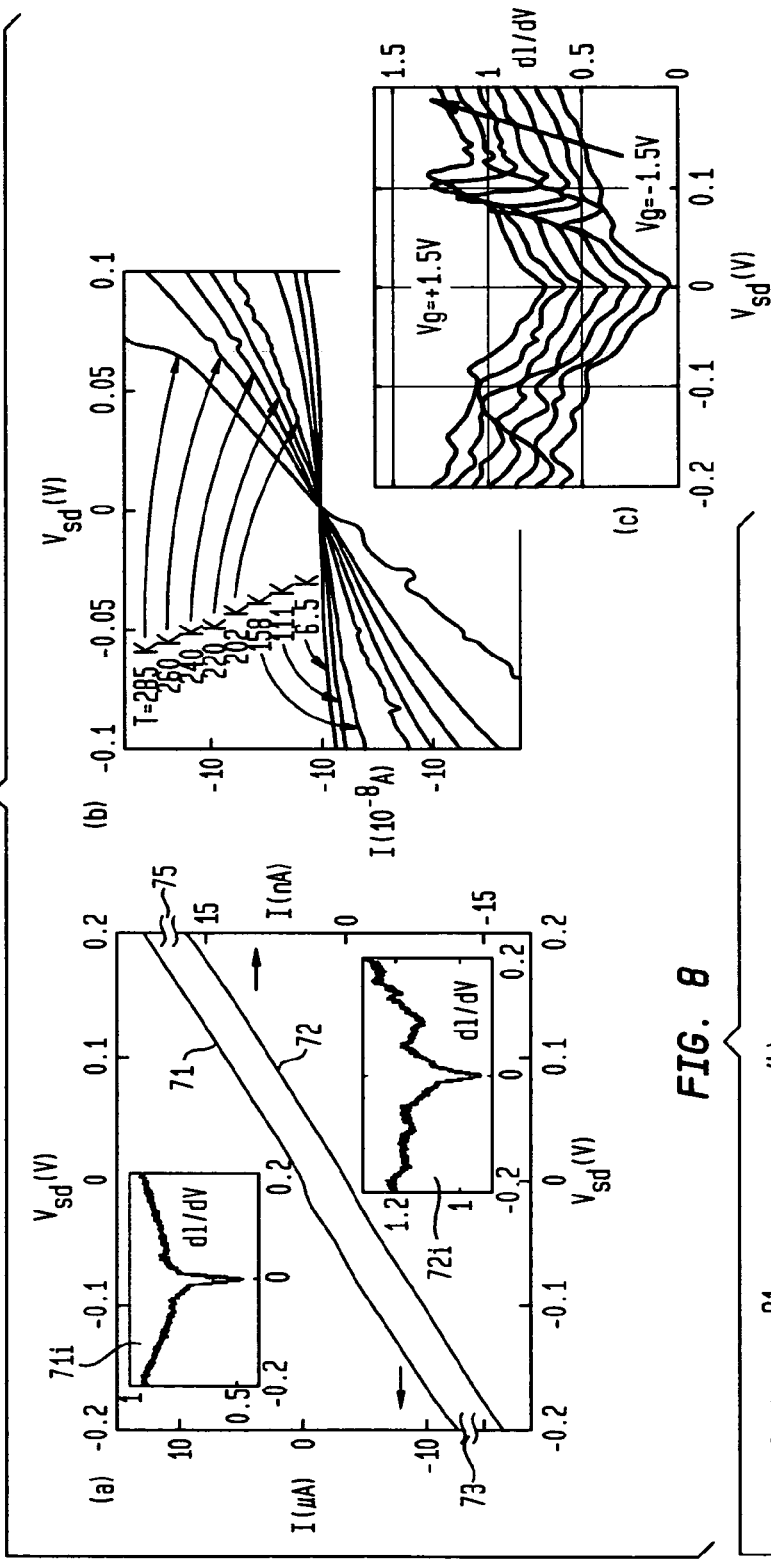
FIG. 7 shows examples of characteristic transport behavior in the devices fabricated according to the procedures of FIG. 4.

Junction resistance measured at room temperature only partly characterizes the transport properties. The conductance of the junctions as a function of source-drain voltage and temperature was also studied. The specific details of current-voltage (I-V) curves varied significantly as can be expected from the broad distribution of conductance values. Some representative results are illustrated in FIG. 7.

Transport characteristics of all T3-Ti and C10-Ti junctions were quite similar, as were their I-V characteristics shown in FIG. 7a. The top curve 71 is typical of a C10-Ti junction, and the bottom curve 72 is typical of a C10-Ag junction. The functional dependence of this curves is rather similar, but the absolute scales of their conductance differs by a factor of ~1000. Conductance fell only by 5-15% as temperature changed from 300 K to 4.2 K. Low-temperature dI/dV curves were rather smooth, with a small dip near $V_{sd}=0$ (insets, FIG. 7a). The lower conductance, the zero-bias dip, and the smooth dI/dV variation clearly differentiate these junctions from shorted ones. Weak temperature dependence and zero-bias anomaly are the usual signatures of tunneling conductance. Most of the non-shorted C10-Ag and all C10-Au$_{clust}$ junctions also displayed insignificant temperature dependence, but the tunneling conductance in this case was lower by orders of magnitude in comparison with Ti overlayer junctions. A small percentage of other types of junctions also displayed weak temperature dependence of conductance. Note, the subscript "clust" denotes Au with clusters formed at the interface between the SAM layer and the top electrode.

The transport properties of a majority of other junctions with Au and Ag overlayers were more complicated. I-V curves were usually linear at room temperature. Conductance measured at zero source-drain bias fell noticeably with decreasing temperature (FIG. 7b). Low-temperature I-V curves displayed a non-linear region with characteristic voltage scale $V_{sd}$~25-200 mV. This general behavior was typical for T3-Au, C10-Au, T3-Ag, T3-Au$_{clust}$ junctions. Similar behavior has been observed in previous studies of multi-grain junctions fabricated on the sharp quartz templates [19] and has been analyzed in previous publications [19, 20].

Two separate conductance mechanisms contribute to the overall electrical transport. The temperature dependent part of the conductance can be identified as hopping transport, characterized by a small energy scale in the range ~10-150 meV. The residual conductance observed at low temperature is a combination of direct tunneling between contacts, sequential tunneling through low-energy defect states and hopping. The relative contributions of hopping and tunneling to the overall conductance varied broadly from sample to sample.

Finer differences between transport behavior in T3 and C10 SAM devices were seen in the low-temperature dI/dV curves (i.e., FIG. 7c). Conductance peaks shown in FIG. 7c were observed in most of the T3-Au, T3-Ag and T3-Au$_{clust}$ junctions. The positions of the peaks on the dI/dV($V_{sd}$) curves could be shifted by gate voltage in the case of T3-Au and T3-Ag junctions. Such behavior is reminiscent of single-electron charging of isolated islands. In T3-Au$_{clust}$ junctions, the peaks were stronger relative to the smoother background, whereas the peak positions were usually insensitive to the gate voltage. No similar conductance peaks were observed in the majority of C10-Au samples.

DISCUSSION

First, a comment on overall conductance values through the SAM layers compared with previously published results. Commonly accepted [21] tunneling conductance per conjugated molecule of comparable length [22, 23] is $10^{-6}$-$10^{-8}\Omega^{-1}$, and conductance per alkane molecule [24] is $10^{-8}$-$10^{-9}\Omega^{-1}$. A medium size junction measuring ~100 nm×100 nm contains ~$5\times10^4$ molecules. If one assumes that every molecule is well-bonded on both sides, the median resistance of junctions is 20Ω-2Ω and 2-20 kΩ for, respectively, T3 and C10 junctions, as illustrated in FIG. 5 by horizontal rectangles 50a-50f. In most cases, the median experimental resistances were much larger than the estimations based on the literature data. Certainly, the common assumption that all molecules are connected to both contacts may be unrealistic, but the experiment with cluster formation in the Au layer at the top interface with the SAM layer allowed me to reliably estimate the minimal number of connected molecules to be reliably estimated. Conservatively, I assumed that there was just a single bond per metal cluster of the top contact, which means that a representative junction contains ~300 well-bonded molecules. The corresponding resistance estimates were 3 kΩ-300 kΩ for T3 junctions, and 300 kΩ-3 MΩ for C10 junctions (shown in FIG. 6). Clearly, the results show that the tunneling conductance of molecules is lower by 4-6 orders of magnitude for both conjugated and saturated molecules, in strong contrast to the majority of previous calculations and experiments [21].

In fact, in the vast majority of devices the conductance associated with tunneling through the molecular orbitals could not be singled out. High values of tunneling conductance measured in the junctions with Ti overlayers were unlikely related to the electronic structures of the original molecules since no difference between conjugated and saturated molecules was seen in the experiments. Evaporated Ti reacted strongly with organics [12] attacking the SAM and forming Ti carbides and oxycarbides. Tunneling conductance measured in all other junctions was likely to be determined by the microscopic configuration of metal electrodes that had partly penetrated the SAM, and/or a small number of defect states rather than by molecular states.

Figure 8:
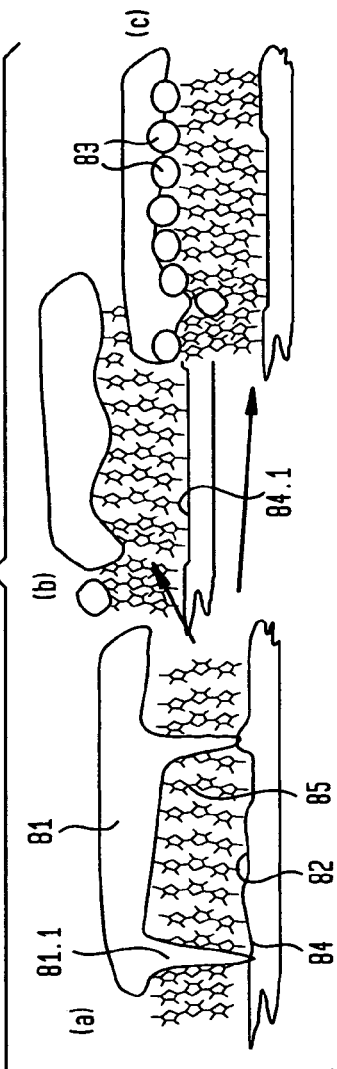
FIG. 8 schematically depicts metal assembly and penetration into the SAM layer illustrating material modifications and interface topography that we studied.

The essential material transformations defining the electronic properties of molecular junctions are schematically illustrated in FIG. 8. Structural defects in SAM layers 85 assembled on as-deposited Au electrodes 82 allowed for easy diffusion (e.g., filaments 81.1) of the top metal electrode 81 through the SAM layer. The SAM structure was significantly improved by annealing the bottom Au electrode 82 before the deposition of self-aligned molecules, as depicted by the smoother bottom Au electrode 84.1 of FIG. 8b. The high yield of non-shorted devices achieved by evaporation of Au on top of SAM layers suggests that practically all incident Au atoms were stopped at the top interface. The overall electrical properties of junctions formed with T3 and C10 SAM devices were rather similar. I believe that during its growth and crystallization, the Au overlayer penetrated deep into the SAM layer (FIG. 8a), exerting substantial pressure and deforming the molecules. The microscopic details of the electrode topography were almost independent of the molecule type in this particular case. Diffusion and growth of Ag overlayers differed depending on the SAM type. Ag penetrated alkane SAM layers more easily. Finally, evaporated Ti strongly reacted with the SAM layers, modifying electronic structure with little discrimination between conjugated and saturated molecules.

Relaxation of the thin Au overlayer accumulated at the top molecular interface and cluster formation resulted in two new phenomena. First, comparing properties of the junctions formed on C10 SAM layers, I suggest that this relaxation significantly reduced stress at the interface and the penetration of the top metal contact into the SAM volume. The C10 junctions with a relaxed top interface were so resistive that their conductance could not be reliably differentiated from a possible leakage through the substrate. Very different behavior was seen on conjugated SAM layers. Effectively, the clusters diffused through the SAM easier than separate Au atoms impinging the SAM layer during the evaporation. The cluster diffusion had to proceed along with a redistribution of molecules in the SAM layer. Apparently, the configuration with the clusters partly or fully submerged into the conjugated SAM layer lowered the total energy of the system. The clusters that formed at the edge of a continuous Au top electrode and partly penetrated into the SAM can account for the systematic observation of conductance resonances sensitive to the gate voltage in T3 junctions.

Residual impurities, clusters, other low-energy defects and interface topography leading to different conductance mechanisms and broad distribution of junction resistances enormously complicate a reliable determination of tunneling conductance through the molecular levels. While a significant disagreement with the literature data can be easily demonstrated based on the full dataset, to estimate the molecular conductance I selected the more resistive junctions with I-V curves displaying negligible contribution from the low-energy transport channels. The estimates gave $R_{T3} > 10^{11} \Omega$ and $R_{C10} > 10^{14} - 10^{15} \Omega$ for T3 and C10, respectively. Simple approximation of tunneling under a rectangular barrier is often useful to relate the values of tunneling resistances with the energy structure. In such a model, $R = R_0 \exp(\beta l)$, where $R_0$ is of the order of the quantum resistance, $l$ is the length of the barrier, $\beta = 2(2m^*E)^{1/2}/h$ is the tunneling decay parameter, $E$ is the barrier height and $m^*$ is the effective mass. Based on the estimates of resistances, $\beta_{C10} \sim 1.5$ and $\beta_{T3} \sim 1.1$, and, assuming $E_{C10} \sim 5$ eV and $E_{T3} = 1.4$ eV (~½ of bandgap), $m^*_{C10} \sim 0.4 m_0$ and $m^*_{T3} \sim 0.8 m_0$, where $m_0$ is the free electron mass. Note that in other well-studied tunnel barriers, such as $AlO_x$ and $SiO_2$, the effective mass is usually close to $0.5 m_0$ [25, 26]. Calculations of molecular tunneling if reduced to the simple single barrier approximation, typically predict much smaller $m^*$ values such as $m^* \sim 0.2 m_0$ for alkanes and $m^* \sim (0.06-0.25) m_0$ for different conjugated molecules [21, 24, 27].

The results clearly expose a variety of material transformations and self-organization processes occurring during integration of organic and inorganic components in nanoscale devices. These experiments are the first that systematically correlate the electrical properties of SAM devices with the microscopic details of the metal-molecule interface. I have demonstrated that the generation of defects can be dramatically reduced for certain combinations of metals and molecules by changing surface topography and growth conditions at the interface.

I claim:

1. Apparatus comprising
   a substrate having a top surface and first metal electrode disposed on at least a portion of said top surface,
   a self-assembled molecular layer disposed on a major surface of said first metal electrode, said molecular layer having a free surface, and
   a second metal electrode having at least a portion thereof disposed on said free surface of said molecular layer, said portion of second metal electrode including metal clusters.

2. The apparatus of claim 1, wherein said first metal electrode has an annealed crystal structure.

3. The apparatus of claim 2, wherein said first electrode has a larger average grain size than non-annealed metal layers of the same composition and same dimension.

4. The apparatus of claim 1, wherein said first electrode, molecular layer and second electrode form a stack along a direction substantially perpendicular to said portion of said top surface.

5. The apparatus of claim 1, wherein said apparatus comprises a diode or a transistor having a channel, said molecular layer forming said channel.

6. The apparatus of claim 5, wherein said second metal electrode comprises Au and said molecular layer comprises a fully saturated molecule.

\* \* \* \* \*

UNITED STATES PATENT AND TRADEMARK OFFICE
CERTIFICATE OF CORRECTION

PATENT NO. : 7,615,779 B2  Page 1 of 1
APPLICATION NO. : 11/387436
DATED : November 10, 2009
INVENTOR(S) : Nikolai Borisovich Zhitenev It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 715 days.

Signed and Sealed this

Nineteenth Day of October, 2010

David J. Kappos
*Director of the United States Patent and Trademark Office*